United States Patent
Xiao et al.

(10) Patent No.: US 9,941,886 B2
(45) Date of Patent: Apr. 10, 2018

(54) INTEGRATED CIRCUIT (IC) CHIP COMPRISING AN IDENTIFICATION CIRCUIT

(71) Applicants: Jimmy Yong Xiao, San Jose, CA (US); Surendra Kumar Rathaur, Los Altos, CA (US); Visvamohan Yegnashankaran, Cupertino, CA (US)

(72) Inventors: Jimmy Yong Xiao, San Jose, CA (US); Surendra Kumar Rathaur, Los Altos, CA (US); Visvamohan Yegnashankaran, Cupertino, CA (US)

(73) Assignee: Casinda Inc., Milpitas, CA (US)

( * ) Notice: Subject to any disclaimer, the term of this patent is extended or adjusted under 35 U.S.C. 154(b) by 0 days.

(21) Appl. No.: 15/675,705

(22) Filed: Aug. 12, 2017

(65) Prior Publication Data
US 2017/0366185 A1    Dec. 21, 2017

Related U.S. Application Data

(62) Division of application No. 14/684,372, filed on Apr. 11, 2015, now Pat. No. 9,768,781.

(51) Int. Cl.
*H03K 19/094* (2006.01)
*H01L 23/544* (2006.01)

(52) U.S. Cl.
CPC ......... *H03K 19/094* (2013.01); *H01L 23/544* (2013.01); *H01L 2223/54433* (2013.01); *H01L 2224/49113* (2013.01); *H01L 2924/00* (2013.01); *H01L 2924/00014* (2013.01); *H01L 2924/13091* (2013.01)

(58) Field of Classification Search
CPC ....... H01L 2924/00; H01L 2924/00014; H01L 2924/13091; H01L 2224/49113; H01L 2223/54433; H01L 23/544
USPC .......................................................... 327/211
See application file for complete search history.

(56) References Cited

U.S. PATENT DOCUMENTS

| | | | | |
|---|---|---|---|---|
| 4,128,773 A | * | 12/1978 | Troutman | G11C 14/00 257/315 |
| 4,132,904 A | * | 1/1979 | Harari | G11C 14/00 257/321 |
| 5,517,461 A | * | 5/1996 | Unno | G11C 7/067 365/189.05 |
| 6,211,713 B1 | * | 4/2001 | Uhlmann | H03K 3/012 327/201 |
| 6,529,421 B1 | * | 3/2003 | Marr | G11C 5/147 327/534 |
| 7,107,202 B1 | | 9/2006 | Hegde et al. | |
| 7,482,657 B1 | * | 1/2009 | Lucero | H01L 27/0207 257/350 |

(Continued)

*Primary Examiner* — James C Kerveros
(74) *Attorney, Agent, or Firm* — Guosheng Wang; United States Research and Patent Firm (57) ABSTRACT

An embodiment of the present invention is an identification circuit for generating an identification number (ID). The identification circuit includes a plurality of identification cells each comprising a latch having a first output and a second output that are opposite to each other. The first output and the second output are a function of process variations of the identification circuit. A first buffer and a second buffer are provided on both sides of the latch and connected to the first output and the second output of the latch, respectively.

14 Claims, 8 Drawing Sheets

(56) References Cited

U.S. PATENT DOCUMENTS

| | | | |
|---|---|---|---|
| RE43,922 E * | 1/2013 | Lucero | H01L 27/0207 257/350 |
| 8,772,880 B2 * | 7/2014 | Fukuda | H01L 27/0207 257/107 |
| 9,237,082 B2 * | 1/2016 | Ziegler | H04L 43/10 |
| 2003/0231538 A1 * | 12/2003 | Rimondi | G11C 7/20 365/202 |
| 2004/0053429 A1 * | 3/2004 | Muranaka | G05B 19/128 438/17 |
| 2006/0039197 A1 * | 2/2006 | Khouri | G11C 16/26 365/185.12 |
| 2008/0042697 A1 * | 2/2008 | Narathong | H03K 21/10 327/115 |
| 2012/0249217 A1 * | 10/2012 | Fukuda | H01L 27/0207 327/436 |
| 2016/0036419 A1 * | 2/2016 | Lin | H03K 3/0375 327/198 |

* cited by examiner

INTEGRATED CIRCUIT (IC) CHIP COMPRISING AN IDENTIFICATION CIRCUIT

CROSS-REFERENCE TO RELATED U.S. APPLICATIONS

This is a divisional application of U.S. application Ser. No. 14/684,372filed Apr. 11, 2015, now U.S. Pat. No. 9,768,781.

STATEMENT REGARDING FEDERALLY SPONSORED RESEARCH OR DEVELOPMENT

Not applicable.

NAMES OF PARTIES TO A JOINT RESEARCH AGREEMENT

Not applicable.

REFERENCE TO AN APPENDIX SUBMITTED ON COMPACT DISC

Not applicable.

FIELD OF THE INVENTION

The present invention generally relates to an integrated circuit (IC) chip, and more particularly, to an IC chip in which an identification circuit is inserted for generating a unique and non-alterable identification number (ID) identifying the IC chip.

BACKGROUND OF THE INVENTION

An identification number (ID) is often desirable for many IC chips or electronic devices. Just like DNA, the ID number can uniquely identify an IC chip or an electronic device containing the IC chip and distinguish it from others, thereby improving recognizability and traceability of products. Moreover, the ID number may be used, for example, to label REID tags, to generate public or private keys for encryption and decryption purposes, to provide authentication, to electronically secure electronic devices and combat IC piracy, to identify nodes on networks, and the like. Due to the diverse applications of the ID number, research on on-chip ID has been done with an aim to improve its reliability, stability and unclonability.

Traditional methods of providing an on-chip ID include using a non-volatile, programmable read-only memory (PROM) in the chip. During or after fabrication of the chip, the PROM may be programmed (burned) to store an ID number as well as other useful manufacturing data. The ID number may be customized to indicate some identity information about the chip, including but not limited to, production date and location code, a lot number, chip model, etc. The ID number may be read back and used for any purpose when the chip is powered on. While such a method can provide each chip with a customized ID number to uniquely identify the chip and provide further information about the chip, they require special processing steps when manufacturing the chip and thus incur additional cost and time expense. In addition, the ID number may be easily altered or cloned, so it is not good for key generation or similar security applications.

It has been proposed to generate a unique ID number by using Physically Unclonable Functions (PUFs). PUFs may be constructed in hardware, which exhibits minimum physical variations and parameter fluctuations as result of unpredictable stimulus applied in the manufacture thereof. PUFs are especially suitable for security applications, because they are easy to generate but practically, they are impossible to duplicate, even using the exact manufacturing process to produce them. A typical example of PUFs is SRAM (static random access memory) PUF. An SRAM cell may be designed to be balanced so that it has no preferred logic state when power is supplied thereto. Because of mismatch originating from fabrication process variations, each SRAM cell will assume a non-random logic state when power is supplied. Thus, an array of SRAM cells may provide a unique ID number.

A disadvantage of SRAM PUF is its insufficient stability. It is known that a focus of the modern technology is trying to fabricate identicallaniform elements or circuits to achieve identical/uniform performance. As a result, the process variations may be very small. On the other hand, noise from adjacent circuits or from external environment may have an impact on the output of the SRAM cells. Therefore, some of the SRAM cells may have random output, causing the generated ID number inconstant. This has become a serious obstacle that hinders SRAM PUF from being used in on-chin ID circuits.

In addition, the SRAM cells are typically formed together with one another as a macro block, and a dedicated read circuit is required to read out ID bits from the macro block. The layout designer has to assign an area on the die large enough to accommodate the macro block and the read circuit. Therefore, the SRAM PUF results in a significant decrease in layout flexibility and an increase in cost.

Advantageously, the present invention can provide a simple identification circuit which is stable and capable of generating a unique and non-alterable ID number. In some embodiments, the identification circuit may have a flexible layout, and it adds little cost to the manufacture process.

SUMMARY OF THE INVENTION

One aspect of the invention provides an identification circuit including a plurality of identification cells each of which comprises a latch having a first output and a second output that are opposite to each other. The first output and the second output are a function of process variations of the identification circuit. A first buffer and a second buffer arc provided on both sides of the latch and connected to the first output and the second output of the latch, respectively.

In various embodiments of the invention the identification cells are dispersed on an integrated circuit (IC) die. The first buffer and the second buffer are symmetrical to each other with respect to the latch, and the first buffer may have a same size as the second buffer. The first buffer and the second buffer may have a feature size equal to or larger than that of the latch. The first buffer may include a first CMOS inverter and the second buffer may include a second CMOS inverter. The first CMOS inverter may have a size same as the second CMOS inverter. The first CMOS inverter may have transistors of a same size as those included in the second CMOS inverter. The transistors of the first CMOS inverter may be positioned symmetrical to those of the second CMOS inverter with respect to the latch. The latch may include a third CMOS inverter and a fourth CMOS inverter that are cross-coupled with each other, and the third CMOS inverter and the fourth CMOS inverter may have a same size.

Another aspect of the invention provides integrated circuit (IC) chip that includes a scan chain having a plurality of stages connected in a chain. At least one of the plurality of stages comprises an identification cell configured to generate an ID bit that is a function of process variations of the IC chip, and a scan flip-flop configured to selectively receive a scan data on a scan line or the ID bit from the identification cell.

In various embodiments of the invention, the at least one of the plurality of stages further comprises a multiplexer connecting the identification cell and the scan line to the scan flip-flop, the multiplexer being configured to selectively pass, under the control of a first control signal, the ID bit from the identification cell to the scan flip-flop; and a demultiplexer connecting an output of the scan flip-flop to all identification line and the scan line that are both connected to a next stage of the scan chain, the demultiplexer being configured to selectively pass, under the control of a second control signal, the output of the scan flip-flop to the identification line. The multiplexer further connects the identification line to the scan flip-flop, and the multiplexer is further configured to pass, under the control of the second control signal, the ID bit on the identification line from a preceding stage of the scan chain to the scan flip-flop of the present stage.

Yet another aspect of the invention provides a system-on-chip (SoC) which comprises a plurality of logic units connected via a bus to a processing unit, and a plurality of identification cells dispersed in at least one of the plurality of logic units, the plurality of identification cells each being configured to generate an ID bit that is a function of process variations of the SoC. The processing unit is configured to extract the ID bits from outputs of the plurality of logic units and form an identification number using the extracted ID bits.

The above features and advantages and other features and advantages of the present invention are readily apparent from the following detailed description of the best modes for carrying out the invention when taken in connection with the accompanying drawings.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements. All the figures are schematic and generally only show parts which are necessary in order to elucidate the invention. For simplicity and clarity of illustration, elements shown in the figures and discussed below have not necessarily been drawn to scale. Well-known structures and devices are shown in simplified form such as block diagrams in order to avoid unnecessarily obscuring the present invention. Other parts may be omitted or merely suggested.

DETAILED DESCRIPTION OF THE PREFERRED EMBODIMENT

In the following description, for the purposes of explanation, numerous specific details are set forth in order to provide a thorough understanding of the present invention. It is apparent, however, to one skilled in the art that the present invention may be practiced without these specific details or with an equivalent arrangement.

It is also to be understood that the terminology used herein is for the purpose of describing particular embodiments only, and is not intended to limit the scope of the invention. For example, when an element is referred to as being "on", "connected to", or "coupled to" another element, it can be directly on, connected or coupled to the other element or intervening elements may be present. In contrast, when an element is referred to as being "directly on", "directly connected to", or "directly coupled to" another element, there are no intervening elements present.

Unless otherwise defined, all terms (including technical and scientific terms) used herein have the same meaning as commonly understood by one of ordinary skill in the art to which this present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Below, respective embodiments will be described in details by reference to the accompanying drawings. Incidentally, in all the drawings for describing the embodiments, the elements having the same function are given the same reference signs and numerals, and a repeated description thereon is omitted. Further, in the following embodiments, a description on the same or similar portions will not be repeated unless otherwise required.

Figure 1:
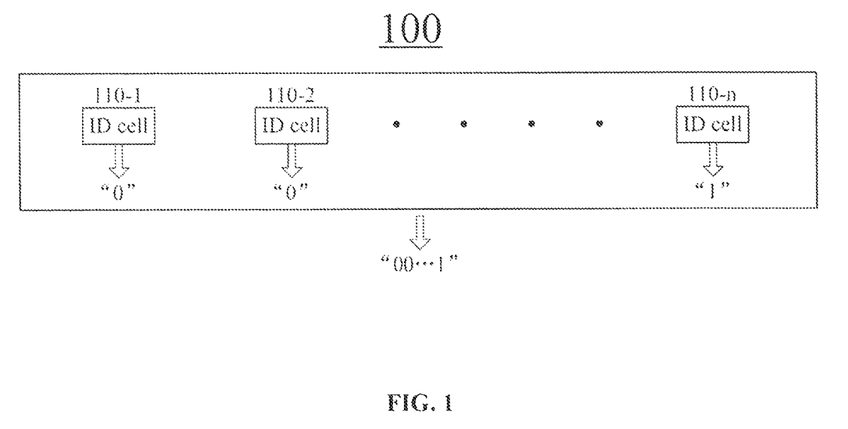
FIG. 1 is a schematic block diagram that illustrates an identification circuit in accordance with an embodiment of the present invention.

FIG. 1 shows a schematic block diagram that illustrates an identification circuit 100 in accordance with an embodiment of the present invention. Referring to FIG. 1, the identification circuit 100 may include a plurality of identification cells 110-1, 110-2, . . . , 110-n, which are collectively referred to as "110" hereinafter. Each of the identification cells 110 may generate an identification bit "1" or "0". The identification circuit 100 can generate an identification number (ID) consisting of the plurality of identification bits. The number "n" of the identification cells 110 may depend on the desirable length of the ID number generated by the identification circuit 100. When more identification cells 110 are used, the generated ID number will be longer and thus be more unique.

in an example, the plurality of identification cells 110 may be placed physically together to form a macro block. Particularly, the plurality of identification cells 110 may be arranged side by side in series, parallel or combination of both. A read circuit may be used to read the ID bits generated from the macro block. The macro block may be positioned at a proper place on an IC die. A macro block configuration of the identification cells 110 will be discussed in detail below.

On the other hand, the plurality of identification cells 110 may be dispersed across an IC die. The ID bits generated from the respective identification cells 110 may be collected and processed to form a full ID number. A dispersing configuration of the plurality of identification cells 110 will also be discussed in detail below.

Figure 2:
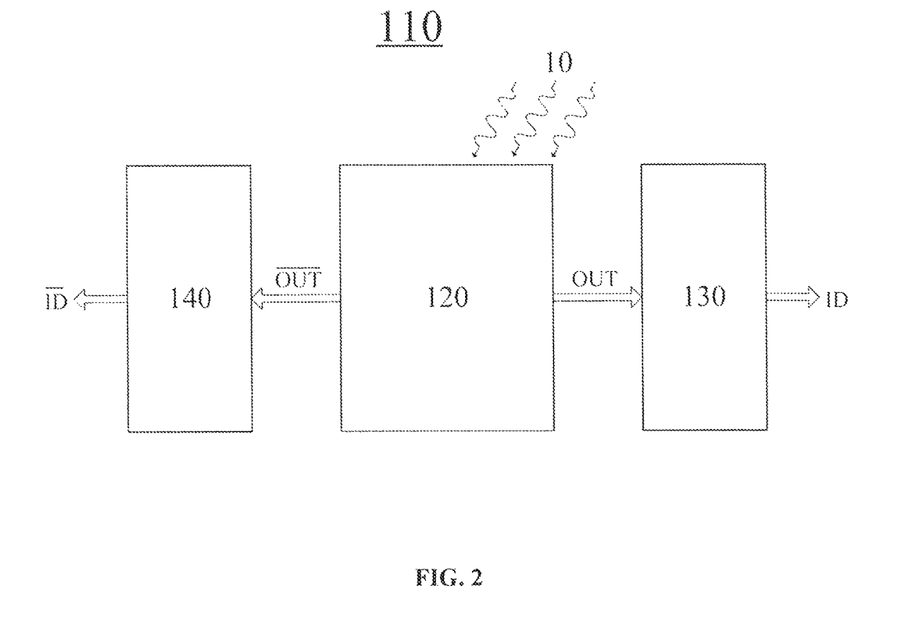
FIG. 2 depicts a schematic block diagram that illustrates an identification cell in accordance with an embodiment of the present invention.

FIG. 2 shows a schematic block diagram that illustrates an example of the identification cell 110 in accordance with an embodiment of the present invention. Referring to FIG. 2, the identification cell 110 may include a latch 120, a first buffer 130 and a second buffer 140.

Latch is a circuit that can switch between two stable states, i.e., a logic high state and a logic low state. A conventional latch has two inputs to receive a SET input and a RESET input to set and reset the latch's state. Latch 120 of the present embodiment, however, has no input. The latch 120 provides only a first output "OUT" and a second output "/OUT" that is opposite to the first output "OUT". For example when the latch 120 stabilizes in a logic low state the first output "OUT" may be a logic "0" and the second output "/OUT" may be a logic "1"; when the latch 120 stabilizes in a logic high state, the first output "OUT" may be a logic "1" and the second output "/OUT" may be a logic "0", or vice versa.

Since the latch 120 has no input, in an ideal condition, the latch 120 would assume a random state when power is applied. That is, the probability of the latch 120 stabilizing in a logic "0" state statistically equals the probability of the latch 120 stabilizing in a logic "1" state. In the present embodiment, however, the latch 120 is designed and fabricated so that the output thereof is a function of fabrication process variations 10.

As technology scales, the feature size reduces thereby requiring a sophisticated fabrication process. Consequently, process variations become more and more significant from element-to-element and from chip-to-chip. There are many sources of process variations. For example, transistor dimensions are the result of a random accumulation of photons through the photomask and reactive ions hitting the portion to be etched. Doping levels and distributions within a transistor are the result of a random distribution of doping atoms from thermal diffusion and ion implantation. Due to these natural, random and unpredictable process variations, no two transistors could be identical to each other. It is not possible to make two identical transistors even though one produces them by the same processes, using the same masks, in adjacent areas of the same IC die. The process variations are random and normally distributed. Designers have long been aware of the effect of such random process variations on the behavior of transistors and other IC circuit elements, and have taken them into account when designing ICs. A good IC design ensures that all copies of an IC behave as expected even though the transistors and other circuit elements forming the ICs exhibit a random variation in operating characteristics from one element to another and from one chip to another.

While such random process variations have been a problem that IC designers need to overcome, the present invention takes advantage of the variations, and makes a good use of them. In particular, the process variations 10, which may be any process variations as discussed above, can cause variations in physical microstructures of elements like the transistors included in the latch 120, including channel length, channel width, gate length, gate width, gate thickness, dopant concentration, dopant distribution, doping depth, gate insulation layer thickness, etc., which in turn lead to variations of transistor's electrical parameters such as threshold voltage Vth, drain-source current Ids, and gate voltage Vg, among others. The parameter variations eventually result in mismatch or imbalance within the latch 120. With the mismatch or imbalance, the latch 120 would not latch to the logic high state and the logic low state at the same possibility. Instead, when power is applied, the latch 120 will latch to a fixed logic state, converting the process variations 10 into a binary digit "1" or "0". Since the mismatch or imbalance within the latch 120 is permanent, the latch 120 will latch to the same logic state every time when the power is applied. In addition, the process variations 10 are random with a normal distribution, the logic states or binary digits captured by the latches 120 will also be random with a normal distribution. Thus, the identification circuit 100 can provide a unique ID number if the number of the ID cells 110 and thus the latches 120 included in the identification circuit 100 is sufficiently large.

To increase the influence of process variations 10 on the latch 120, in an example, the latch 120 may be manufactured with a minimum size that the fabrication process allows. In another example, the interconnections within the latch 120 may also be formed to have minimum widths. When elements or circuits become smaller, the process variations 10 become more significant. The mismatch or imbalance introduced by the process variations 10, in turn, change the random logic state of the latch 120 into a non-random state.

Under some conditions, however, the process variations may still be insufficient, causing the latch 120 to change its logic state when power is applied. To address this problem, in this embodiment, the first buffer 130 and the second buffer 140 are provided.

Referring to FIG. 2, the first buffer 130 and the second buffer 140 are positioned at both sides of the latch 120. In an example, the first buffer 130 and the second buffer 140 may be symmetrical to each other with respect to the latch 120. The first buffer 130 may be connected to and receive the first output "OUT" of the latch 120, and provide an output "ID". The output "ID" of the first buffer 130 may be an ID bit for generating the ID number. The second buffer 140 may be connected to and receive the second output "/OUT" of the latch 120, and may provide an output "ID". The output "ID" of the second buffer 140 may be opposite to the output "ID" of the first buffer 130. For example, when the output of the first buffer 130 is a logic high state, the output of the second buffer 140 is a logic low state, or vice versa.

In addition to buffering, the first buffer 130 and the second buffer 140 further function to isolate the latch 120 from adjacent elements or circuits. As discussed above, the process variations 10 may be very small, and the latch 120 needs to be very sensitive to detect the mismatch or imbalance therein. With the continual miniaturization of electronic devices, however, circuit density becomes higher, and noise from adjacent circuits becomes a severe problem, especially for some sensitive elements like the latch 120. In the embodiment shown in FIG. 2, the first buffer 130 and the second buffer 140, which are provided at both sides of the latch 120, can effectively isolate the latch 120 from noise of adjacent elements or circuits. As a result, the latch 120 can capture subtle process variations 10 and convert them into a fixed logic state, and the latch 120 can latch to the fixed logic state every time power is applied. In turn, the identification circuit 100 can generate a constant ID number. Accordingly, the stability of the identification circuit 100 is improved. Besides, since the latch 120 is isolated from adjacent noise, the ID cell 110 may be placed anywhere on an IC die, thereby improving the flexibility of the layout design.

In an example, similar to the latch 120, the first buffer 130 and the second buffer 140 may also be formed with a minimum size that the fabrication process allows. In such a case, the first buffer 130 and the second buffer 140 themselves will impose less impact on the latch 120, thereby further improving the stability of the ID cell 110.

Figure 3:
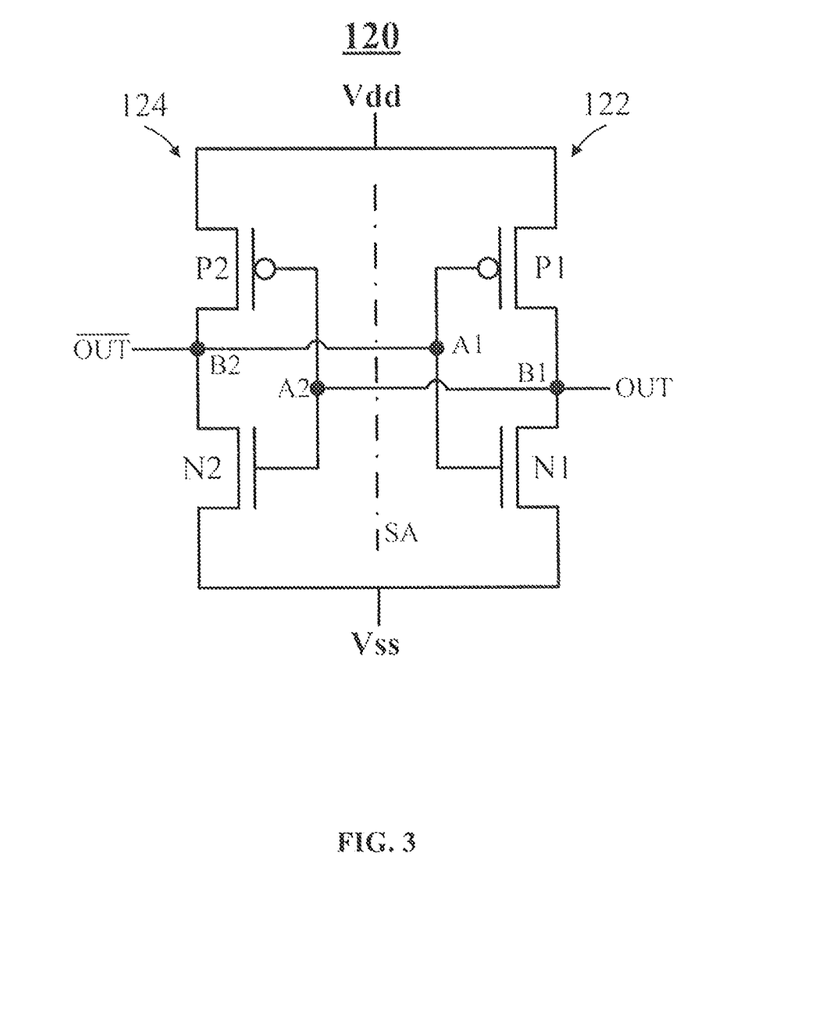
FIG. 3 shows a circuit diagram that illustrates an example of a latch of FIG. 2 in accordance with an embodiment of the present invention.

FIG. 3 shows a circuit diagram that illustrates an example of the latch 120 in accordance with an embodiment of the present invention. As shown in FIG. 3, the latch 120 may include a first CMOS inverter 122 and a second CMOS inverter 124 that are cross-coupled with each other.

Specifically, the first CMOS inverter 122 may have a PMOS transistor P1 and a NMOS transistor N1. The PMOS transistor PI has a source connected to a power supply voltage Vdd, a drain connected to a drain of the NMOS transistor N1, and a gate connected to a gate of the NMOS transistor N1. The NMOS transistor N1 has its source connected to a ground voltage Vss. The second CMOS inverter 124 may have a PMOS transistor P2 and a NMOS transistor N2. The PMOS transistor P2 has a source connected to the source of the PMOS transistor P1 and to the power supply voltage Vdd, a drain connected to a drain of the NMOS transistor N2, and a gate connected to a gate of the NMOS transistor N2. The NMOS transistor N2 has its source connected to the source of the NMOS transistor N1 and to the ground voltage Vss.

The input node A1 of the first CMOS inverter 122 is connected to the output node B2 of the second CMOS 124, and the output node 131 of the first CMOS inverter 122 is connected to the input node A2 of the second CMOS 124. With such a configuration, the output of the first CMOS inverter 122 and the output of the second CMOS inverter 124 have to he opposite to each other. The output of the first CMOS inverter 122 may function as the first output "OUT" of the latch 120, and the output of the second CMOS 124 may function as the second output "/OUT" of the latch 120.

The latch 120 shown in FIG. 3 is made up of four MOS transistors. As discussed above, due to process variations, it is not possible to make two identical transistors even though they are formed by the same processes, using the same masks, in adjacent areas of the same IC die. The process variations may cause variations in physical microstructures of the MOS transistors, including channel length, channel width, gate length, gate width, gate thickness, dopant concentration, dopant distribution, doping depth, gate insulation layer thickness, etc., which in turn lead to the variations of transistor electrical parameters such as threshold voltage Vth, drain-source current Ids, gate voltage Vg, etc. The parameter variations eventually result in mismatch between the first CMOS inverter 122 and the second CMOS inverter 124.

Such a mismatch will be better understood from operation of the latch 120, which will be discussed below. At the beginning, the power supply voltage Vdd is not applied. We can assume the voltage Vgs for transistors P1, P2, N1 and N2 is about zero, so the PMOS transistors P1 and P2 are in an ON state and the NMOS transistors N1 and N2 are in an OFF state. When the power supply voltage Vdd is first applied. the sources of the PMOS transistors P1 and P2 have a high voltage level, and the gates of the PMOS transistors P1 and P2 still have a low voltage level, which cause the PMOS transistors P1 and P2 to turn on and begin passing current to nodes B1 and B2, respectively. Since the NMOS transistors N1 and N2 are in an OFF state, the voltages on the nodes B1 and B2 start rising or increasing.

As the voltages on the nodes B1 and B2 use the voltages on the nodes A1, A2 and thus on the gates of the transistors P1, P2, N1 and N2 also rise due to the cross-coupling configuration, which makes the PMOS transistors P1, P2 trend to, or intend to, turn off and the NMOS transistors N1, N2 trend to, or intend to, turn on. Due to mismatch between the first CMOS inverter 122 and the second CMOS inverter 124 that originates from process variations as discussed above, the voltage change on the nodes A1 and B2 is slightly different from that on the nodes A2 and B1, which eventually leads to an imbalance within the latch 120. That is, one of the first CMOS inverter 122 and the second CMOS inverter 124 will assume a logic high state, while the other one will assume a logic low state. Then, the latch 120 reach a stable state.

In contrast to an ideal condition where all transistors are identical within a latch (i.e., no mismatch) and thus the latch will latch to a logic high state and a logic low state at an equal, or same, possibility, the latch 120 of this embodiment will latch to a fixed logic state due to the mismatch between the first CMOS inverter 122 and the second CMOS inverter 124 resulting from the process variations 10. Such fixed logic state will not change when power is applied, because the mismatch is permanent.

In a preferred embodiment, the latch 120 has a symmetrical configuration. In particular, the transistors of the first CMOS inverter 122 may be positioned symmetrical to the transistors of the second CMOS inverter 124 with respect to an imaginary line SA that passes roughly through the center of the latch 120. In an example, the PMOS transistor P1 of the first CMOS inverter 122 may have the same size as the PMOS transistor P2 of the second CMOS inverter 124, and the NMOS transistor N1 of the first CMOS inverter 122 may have the same size as the NMOS transistor N2 of the second CMOS inverter 124. In another example, all the transistors P1, P2, N1 and N2 of the latch 120 may have the same size. The symmetrical configuration of the latch 120 can cancel out impact of some environment factors such as temperature change, supply voltage swing, and process corner etc., because the impact will be the same on the transistors that sense the mismatch, thereby reducing or avoiding interference from the environment where the chip operates.

As known to a skilled artisan in the field, modern technology focuses on reducing process variations and therefore fabricating identical elements or circuits. Transistors within an IC die are usually fabricated in the same steps, and thus the process variations 10 may be very small. If the process variations 10 are insufficient, the output of the latch 120 may he random, causing the identification circuit 100 unstable. In a preferred embodiment of the present invention, all the transistors of the latch 120 are designed to have a minimum size that the fabrication process allows. Smaller transistors are typically affected more by process variations, resulting a bigger mismatch within the latch 120. Consequently, the latch 120 will latch to a fixed logic state "1" or "0" every time when power is applied, thereby improving stability of the identification circuit 100.

Figure 4A:
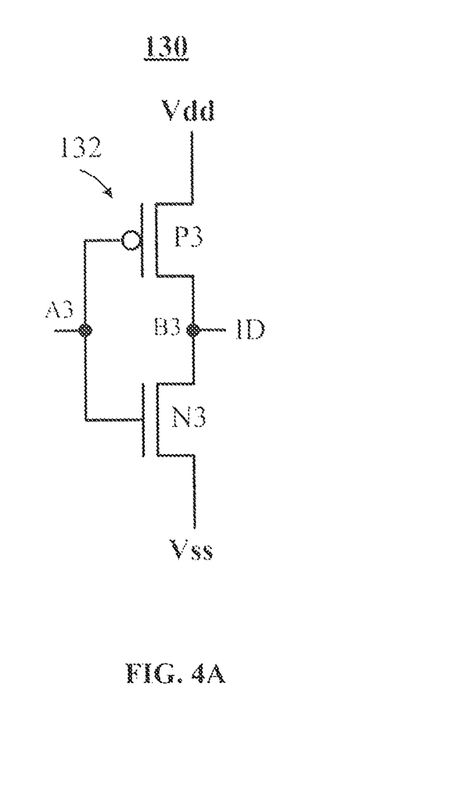
FIG. 4A depicts a circuit diagram that illustrates an example of a first buffer of FIG. 2 in accordance with an embodiment of the present invention.
Figure 4B:
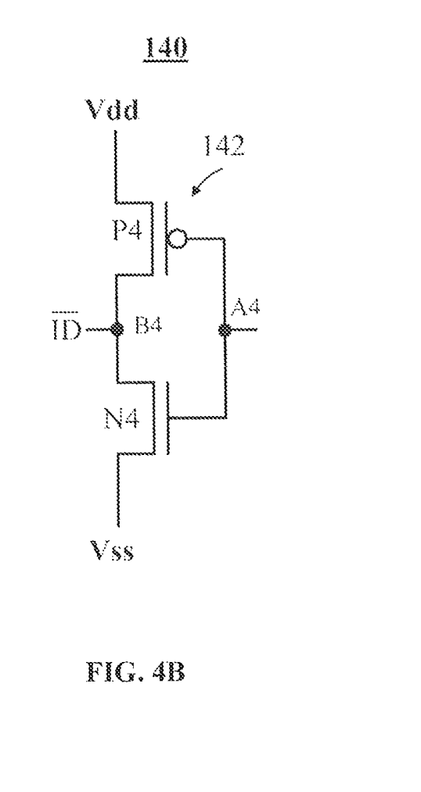
FIG. 4B is a circuit diagram that illustrates mm example of a second buffer in accordance with an embodiment of the present invention.

FIG. 4A and FIG. 4B show examples of the first buffer 130 and the second buffer 140, respectively, in accordance with an embodiment of the present invention. Referring to FIGS. 4A and 4B, the first buffer 130 may include a third CMOS inverter 132, and the second buffer 140 may include a fourth CMOS inverter 42. The third CMOS inverter 132 may include a PMOS transistor P3 and a NMOS transistor N3. The PMOS transistor P3 has a source connected to the power supply voltage Vdd, a drain connected to a drain of the NMOS transistor N3, and a gate connected to a gate of the NMOS transistor N3. The NMOS transistor N3 has its source connected to the ground voltage Vss. The fourth CMOS inverter 142 may include a PMOS transistor P4 and a NMOS transistor N4. The PMOS transistor P4 has a source connected to the power supply voltage Vdd, a drain connected to a drain of the NMOS transistor N4, and a gate connected to a gate of the NMOS transistor N4. The NMOS transistor N4 has its source connected to the around voltage Vss.

The input node A3 of the third CMOS inverter 132 is connected to the first output node B1 of the latch 120, and the output node B3 of the third CMOS inverter 132 may provide an identification bit "ID", which has a logic level opposite to the first output "OUT" of the latch 120. The input node A4 of the fourth CMOS inverter 142 is connected to the second output node B2 of the latch 120, and the output node B4 of the fourth CMOS inverter 142 may provide an identification bit "/ID", which has a logic level opposite to the second output "/OUT" of the latch 120.

With reference to FIGS. 2, 4A and 4B, the third CMOS inverter 132 and the fourth CMOS inverter 142 may be positioned at both sides of the latch 120. In this embodiment, as discussed above, the third CMOS inverter 132 and the fourth CMOS inverter 142 can effectively isolate the latch 120 from noise of adjacent elements or circuits. Therefore, the latch 120 and thus the identification cell 110 can latch to a fixed logic state when power is applied, no matter where it is placed on the IC die. Further, this configuration can also improve flexibility of the layout design.

In a preferred embodiment, the third CMOS inverter 132 and the fourth CMOS inverter 142 may be symmetrical to each other with respect to the latch 120. In an example, the identification cell 110, which includes the latch 120 and the third and fourth CMOS inverters 132, 142, may be symmetrical with respect to the imaginary line SA that passes roughly through the center thereof. As discussed above, the symmetrical configuration can reduce impact of environment variations on the latch 120, because the impact will be the same on the transistors and thus will be canceled out.

In an example, like the latch 120, the transistors of the third and fourth CMOS inverters 132 and 142 may also have a minimum size that the fabrication process allows. In this case, the third and fourth CMOS inverters 132 and 142 themselves will impact less on the latch 120. In another example, the transistors of the third and fourth CMOS inverters 132 and 142 may have a feature size larger than that of the latch 120. In this case, the third and fourth CMOS inverters 132 and 142 can read out the logic state of the latch 120 more quickly, and the identification cell 110 can run faster.

In the embodiments discussed above, the identification cell 110 includes four CMOS inverters, i.e., eight MOS transistors. Since the identification cell 110 is formed of only transistors, it does not need any additional mask, etching or doping step(s). In this regard, the identification circuit 100 of the present invention does not add any additional cost. Further, because the identification cell 110 includes only four CMOS inverters, the power consumption thereof is nearly negligible.

Returning to FIG. 1, with the plurality of identification cells 110 discussed above, the identification circuit 100 may generate an identification number (ID) with a desirable length. For example, 64 identification cells 110 may be used to generate an ID number having 64 bits. Using more identification cells 110 is beneficial for enhancing the uniqueness of the ID number. The number of the identification cells 110 used within the identification circuit 100 for an IC chip may be decided based on the desired length of the ID number.

Figure 5:
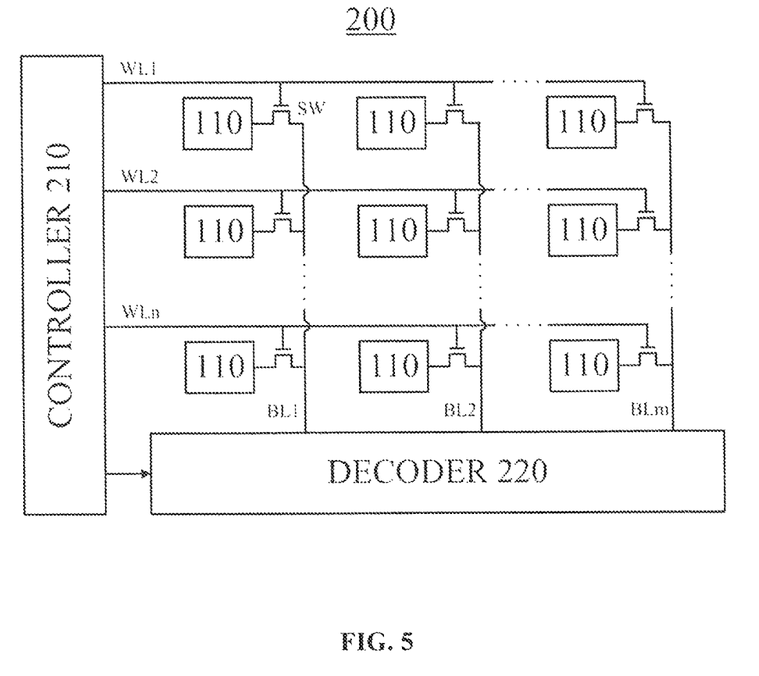
FIG. 5 depicts a circuit diagram that illustrates an example of an identification circuit in accordance with an embodiment of the present invention.

FIG. 5 shows a schematic diagram that illustrates an example of an identification circuit 200 in accordance with an embodiment of the present invention. As shown in FIG. 5, the identification circuit 200 includes a plurality of identification cells 110 arranged in an m×n array so as to form a macro block.

Referring to FIG. 5, the identification circuit 200 includes word lines WL1, WL2, . . . , WLn that extend in a first direction, for example, a horizontal direction, and bit lines BL1, BL2, . . . , BLm that extend in a second direction intersecting the first direction, for example, a vertical direction. The plurality of identification cells 110 may be positioned near intersections of the word lines and the bit lines and connected via a switch transistor SW to the neighboring word and bit lines. The switch transistor SW may have a first current terminal connected to the output of the identification cell 110, a second current terminal connected to the bit line BL, and a control terminal connected to the word line WL.

As discussed above, the identification cell 110 may have two output terminals, i.e., the first output terminal providing "ID" and the second output terminal providing "ID". In the embodiment shown in FIG. 5, only one of the first and second output terminals is connected, and the other one may be suspended. The output terminal of the identification cell 110 connected to the bit line BL may be either the "ID" terminal or the "ID" terminal. In another embodiment, the identification circuit 200 may include additional m bit lines and both of the "ID" terminal and the "/ID" terminal of the identification cell 100 are connected to the bit lines BL. In such an embodiment, for exampled the output "ID" and the output "/ID" of an identification cell 110 may be used to check whether the identification cell 110 operates properly. If the output "ID" has a logic state opposite to that of the output "/ID", the identification cell 110 works well; otherwise, the identification cell 110 is malfunctioning, The identification circuit 200 may further include a controller 210 and a decoder 220. The controller 210 may control operation of the identification circuit 200. Although not shown in FIG. 5, the identification circuit 200 may further include power supply lines and ground lines to apply power to the respective identification cells 110.

In operation, the controller 210 may control the power supply lines to apply power to the identification cells 110, and the identification cell 110 may develop a fixed logic state in response to the power. Under the control of the controller 210, the word lines WL1-WLn and the bit lines BL1-BLm may be selected sequentially so that the logic state of the respective identification cells 110 may be read out by the decoder 220. The decoder 220 may output a full identification number by using the identification bits from the respective identification cells 110.

Although not shown, the word lines WL1-WLn and the bit lines BL1-BLm may be further connected to ground through transistors. Before power is applied to the identification cells 110, the controller 210 may turn on such transistors so that, the word lines WL1-WLn and the bit lines BL1-BLm can all be pulled down to ground. It may prevent or eliminate any interference from the word lines WL1-WLn and the bit lines BL1-BLm to the identification cells 110, thereby improving stability of the identification circuit 200, especially when process variations are very small.

Figure 6:
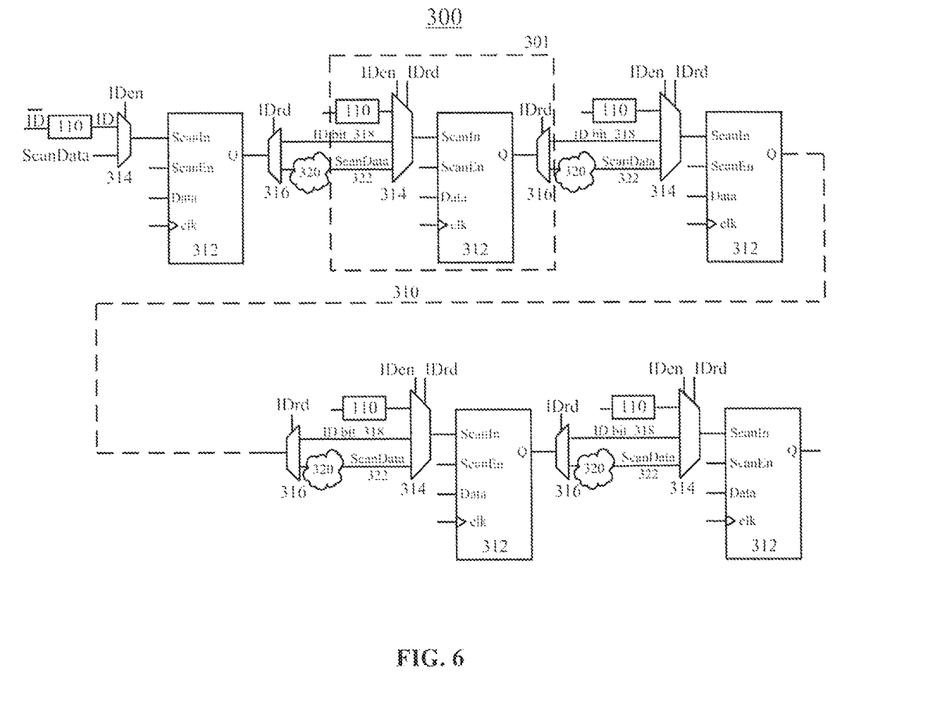
FIG. 6 depicts a circuit diagram that illustrate an example of an integrated circuit in accordance with an embodiment of the present invention.

FIG. 5 has shown the embodiment where the identification cells 110 are placed together forming a macro block. As mentioned above, the identification cells 110 may also be dispersed anywhere on an IC die. FIG. 6 shows such an embodiment.

Referring to FIG. 6, an integrated circuit 300 includes a plurality of identification cells 110 that are discretely inserted into a scan chain 310. Scan chain has been widely used in modern IC designs for rapid test and debug purposes. The scan chain 310 includes a number of chain stages 301 that are arranged in a serial fashion, and each stage 301 may include a typical scan flip-flops 312. The typical scan flip-flop 312 may have a "ScanIn" terminal to receive scan data, a "ScanEn" terminal to receive a scan enable signal, a "Data" terminal to receive external data, and a "clk" terminal to receive a clock signal. When the scan enable signal is asserted on the ScanEn terminal, the scan flip-flop 312 will accept scan data on the ScanIn terminal on the next edge of the clock signal, and when the scan enable signal is deasserted, the scan flip-flop 312 will accept external data on the Data terminal on the next edge of the clock signal. The scan flip-flop 312 provides output at the terminal Q to a next stage of the chain. With such configuration, the scan chain 310 can receive known scan data at the ScanIn terminal of the first scan flip-flop 312 and provide scan output at the Q terminal of the final scan flip-flop 312.

As shown in FIG. 6, the scan chain 310 may further include a multiplexer 314 at each stage 301 thereof. The multiplexer 314 may have a first input terminal to receive an identification bit from the identification cell 110, a second input terminal to receive an identification bit on an identification line 318 from a preceding stage 301, and a third input terminal to receive scan data on a scan line 322 from the preceding stage 301. The multiplexer 314 may be controlled by a first control signal IDen and a second control signal IDrd. When the first control signal IDen is asserted, the multiplexer 314 passes the ID bit from the identification cell 100 to the scan flip-flop 312; when the second control signal IDrd is asserted, the multiplexer 314 passes the ID bit on the identification line 318 from the preceding stage 301 to the scan flip-flop 312; when the first and second control signals IDen, IDrd are both deasserted, the multiplexer 314 passes the scan data on the scan line to the scan flip-flop 312.

The scan chain 310 may further include a demultiplexer 316 at each stage 301 thereof. The demultiplexer 316 may have an input connected to the output terminal Q of the scan flip-flop 312, and two outputs connected to the identification line 318 and the scan line 322 to the next stage 301, respectively. A combinational logic 320 may be connected in the scan line 322. The demultiplexer 316 is controlled by the second control signal IDrd.

The scan flip-flop 312 can receive the ID bit from the identification cell 110 or from the identification line 318, and the scan data from the scan line 322; and output the ID bit and the scan data through the same output terminal Q. That is, the ID bit and the scan data share the same output terminal Q. To separate the ID bit and the scan data from each other, the demultiplexer 316 is connected to the output terminal Q. When the second control signal IDrd is asserted, the ID bit stored in the scan flip-flop 312 will be passed through the demultiplexer 316 to the identification line 318. When the second control signal IDrd is deasserted, the scan data stored in the scan flip-flop 312 will be passed through the demultiplexer 316 to the scan line 322 and in turn to the combinational logic 320.

Figure 7:
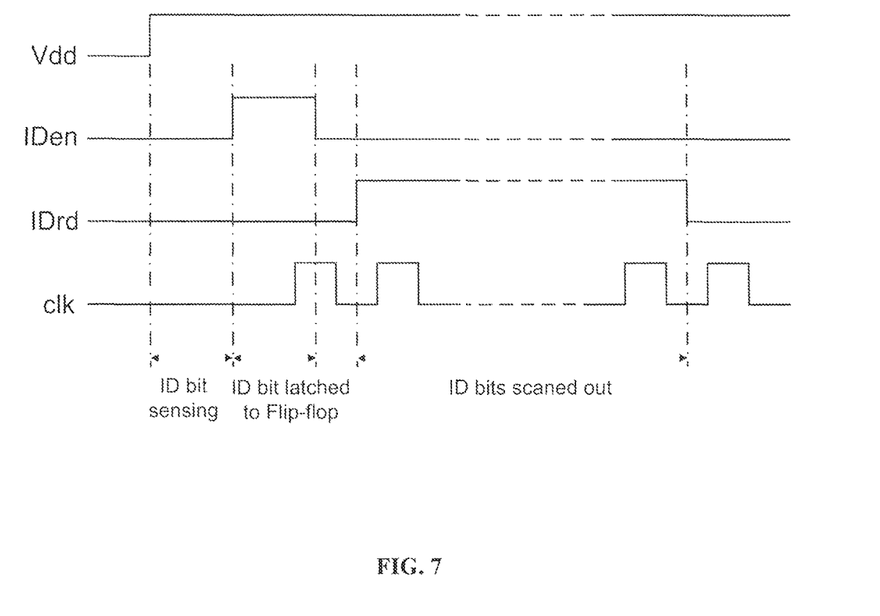
FIG. 7 depicts a timing, chart that illustrates exemplary operation of the integrated circuit shown in FIG. 6 in accordance with an embodiment of the present invention.

FIG. 7 depicts a timing chart that illustrates exemplary operation of the integrated circuit 300 shown in FIG. 6 in accordance with an embodiment of the present invention. Now the operation of the integrated circuit 300 will be discussed with reference to FIGS. 6 and 7.

At the beginning, the power supply voltage Vdd is applied to the integrated circuit 300, and the plurality of identification cells 110 each develop a fixed logic state. Then, the first control signal IDen is asserted, which allows the multiplexer 314 to pass the ID bits from the identification cells 110 to the respective scan flip-flops 312. At the end of the IDen pulse, each scan flip-flop 312 is fixed to an ID bit.

Next, the second control signal IDrd is asserted. With the IDrd signal on, the ID bit latched in the scan flip-flop 312 is shifted through the demultiplexer 316, the identification line 318, the multiplexer 314 eventually to the scan flip-flop 312 of the next stage 301. Using the clock pulses, the shifting operation repeats many times, and all the ID bits get read out from the output terminal Q of the final scan flip-flop 312 of the scan chain 310.

Since the identification cells 110 are very small, and they are dispersed into the scan chain 310, the identification cells 110 need almost no extra silicon real-estate. As compared to embodiments where the identification cells 110 form a macro block, the embodiment shown in FIG. 6 may save the die area more and facilitate miniaturization of the chips. In addition, the identification cells 110 can utilize the input/output (I/O) circuit of the scan chain 310, which eliminates the need of a dedicated I/O circuit for the identification cells 110. Therefore, it may further reduce the cost of the chip.

Figure 8:
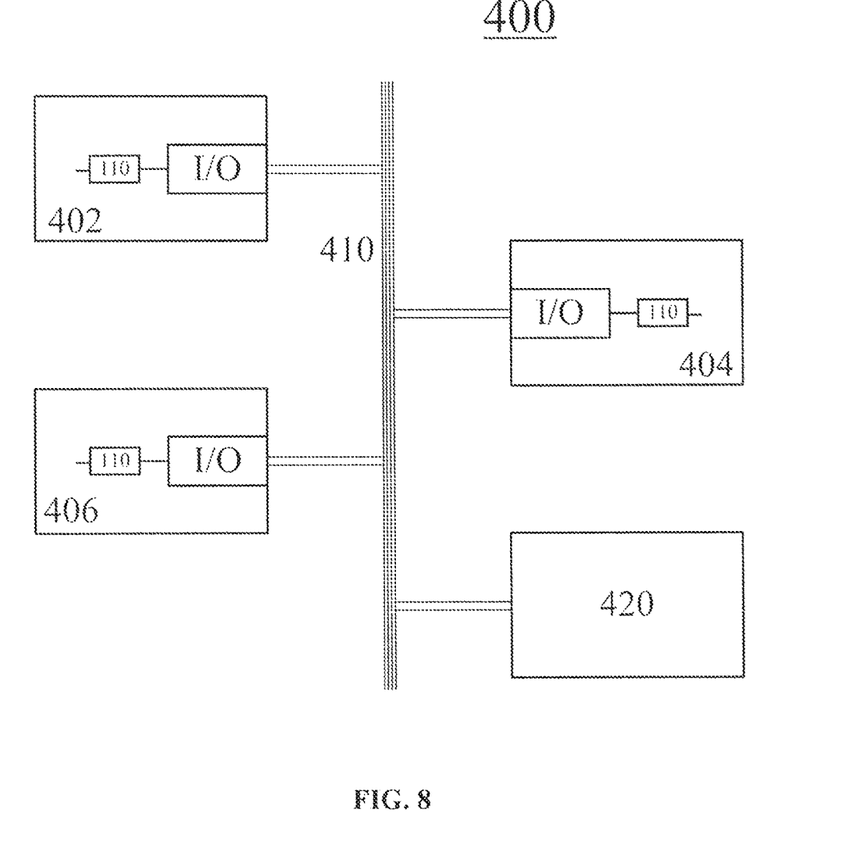
FIG. 8 depicts a block diagram that illustrates an example of a System on Chip in accordance with an embodiment of the present invention.

Scan chain is merely a particular application of the identification cells of the present invention. It would be apparent for those skilled in the art that the identification cells may also be used in other circuits or systems. FIG. 8 shows an example of such systems, system 400.

Referring to FIG. 8, the system 400 may be, for example, a System on Chip (SoC) that includes a plurality of logic units, such as logic units 402, 404 and 406. Although three logic units 402-406 are shown in FIG. 8, the SoC 400 may include more or less logic units. Each logic unit 402-406 may include an I/O circuit and it may be connected to a bus 410 through the I/O circuit. A processing unit 420 is also connected to the bus 410. The bus 410 may transfer data between the logic units 404-406 and between the units 404-406 and the processing unit 420.

A plurality of identification cells 110 may be dispersed among the plurality of logic units 402-406. The identification cells 110 may disperse in at least one of the plurality of logic units 402-406. In other words, one or more of plurality of logic units 402-406 may include no identification cell 110. For the logic units 402-406, each may include a different number of the identification cells 110.

The identification cell(s) 110 included in the logic unit may share the I/O circuit of the logic unit. Then, the identification cell 110 may send its ID bit through the I/O circuit and the bus 410 to the processing unit 420. The processing unit 420 may receive outputs from the plurality of logic units 402-406 and extract the ID bits contained therein. The processing unit 420 may rearrange the ID bits in accordance with where the ID bits come from and form a full ID number. If a plurality of identification cells 110 are included in one logic unit, the ID bits generated in the logic unit may form a data block and then the logic unit outputs the data block. The processing unit 420 may rearrange the data blocks from the respective logic units. In another example, the ID bits may be encoded with addresses before they are outputted from the logic units to the processing unit 420, and the processing unit 420 may rearrange the ID bits in accordance with their addresses.

In the embodiment of FIG. 8, the identification cells 110 are dispersed among the plurality of logic units of the SoC 400. In addition to advantages discussed above, the identification cells 110 may also serve for circuit diagnosis. Typically, the SoC 400 may include many logic units. If ID bits from a certain unit are missing or mismatching, it can be supposed that a malfunction occurs in the unit. Therefore, the ID bits can be used to locate defective circuits quickly. Besides, such a configuration may further ensure integrity of the SoC 400. This is useful for IC protection and combating IC counterfeit.

The identification circuit, the integrated circuit (IC) chip, and the system-on-chip (SoC) of the present invention may be produced with any suitable methods and materials known to a skilled person in the semiconductor industry, which will be not be repeated in this disclosure.

In the foregoing specification, embodiments of the present invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicant to be the scope of the invention, is the literal and equivalent scope of the set of claims that issue from this application, in the specific form in which such claims issue, including any subsequent correction.

The invention claimed is:

1. An integrated circuit (IC) chip (300) with an identification number (ID), the IC chip including a scan chain (310) having a plurality of stages (301) connected in a chain, at least one of the plurality of stages comprising:
    an identification cell (110) configured to generate an ID bit that is a result of fabrication process of said IC chip; and
    a scan flip-flop (312) configured to selectively receive a scan data on a scan line (322) or the ID bit from the identification cell,
    wherein the identification cell comprises:
        a latch having a first output and a second output that are opposite to each other; and
        a first buffer and a second buffer provided on both sides of the latch and connected to the first output and the second output of the latch, respectively,
        wherein the latch includes two permanently mismatched CMOS inverters (122 and 124) that are cross-coupled with each other by directly connecting an input node (A1) of one of said two CMOS inverters (122) to an output node (B2) of another one of said two CMOS inverters (124), and by directly connecting an output node (B1) of said one of said two CMOS inverters (122) to an input node (A2) of said another one of said two CMOS inverters (124), and
        wherein the output of said one of said two CMOS inverters (122) functions as the first output of the latch, and the output of said another one of said two CMOS inverters (124) functions as the second output of the latch.

2. The IC chip of claim 1, wherein the first buffer and the second buffer are symmetrical to each other with respect to the latch.

3. The IC chip of claim 1, wherein the first buffer has a size same as the second buffer.

4. The IC chip of claim 1, wherein the first buffer and the second buffer have a feature size equal to or larger than that of the latch.

5. The IC chip of claim 1, wherein the first buffer includes a first CMOS inverter (132).

6. The IC chip of claim 5, wherein the second buffer includes a second CMOS inverter (142).

7. The IC chip of claim 6, wherein the first CMOS inverter has a size same as the second CMOS inverter.

8. The IC chip of claim 6, wherein the transistors included in the first CMOS inverter have a size same as the transistors included in the second CMOS inverter.

9. The IC chip of claim 6, wherein the transistors of the first CMOS inverter are positioned symmetrical to the transistors of the second CMOS inverter with respect to the latch.

10. The IC chip of claim 1, wherein said two permanently mismatched CMOS inverters (122 and 124) have a same size,
    wherein said one of said two CMOS inverters (122) comprises a PMOS transistor P1 and a NMOS transistor N1,
    wherein the PMOS transistor P1 has a source connected to a power supply voltage Vdd, a drain connected to a drain of the NMOS transistor N1, and a gate connected to a gate of the NMOS transistor N1,
    wherein the NMOS transistor N1 has its source connected to a ground voltage Vss,
    wherein said another one of said two CMOS inverters (124) comprises a PMOS transistor P2 and a NMOS transistor N2,
    wherein the PMOS transistor P2 has a source connected to the source of the PMOS transistor P1 and to the power supply voltage Vdd, a drain connected to a drain of the NMOS transistor N2, and a gate connected to a gate of the NMOS transistor N2, and
    wherein the NMOS transistor N2 has its source connected to the source of the NMOS transistor N1 and to the ground voltage Vss.

11. The IC chip of claim 10, wherein the transistors included in one of the two CMOS inverters are positioned symmetrical to the transistors included in another one of the two CMOS inverters with respect to an imaginary line that passes roughly through the center of the latch, and all the transistors included in the latch are formed with a minimum size that the process of forming the identification circuit allows.

12. The IC chip of claim 1, wherein the at least one of the plurality of stages further comprises a multiplexer (314) connecting the identification cell (110) and the scan line (322) to the scan flip-flop (312), and wherein the multiplexer (314) is configured to selectively pass, under the control of a first control signal (Den), the ID bit from the identification cell (110) to the scan flip-flop.

13. The IC chip of claim 12, wherein the at least one of the plurality of stages further comprises a demultiplexer (316) connecting an output (Q) of the scan flip-flop to an identification line (318) and the scan line (322) that are both connected to a next stage of the scan chain, and wherein the demultiplexer is configured to selectively pass, under the control of a second control signal (IDrd), the output of the scan flip-flop to the identification line (318).

14. The IC chip of claim 13, wherein the multiplexer (314) further connects the identification line (318) to the scan flip-flop, and the multiplexer is further configured to pass, under the control of the second control signal (IDrd), the ID bit on the identification line from a preceding stage of the scan chain to the scan flip-flop of the present stage.

* * * * *